United States Patent
Heinrich et al.

(10) Patent No.: US 8,920,091 B2
(45) Date of Patent: Dec. 30, 2014

(54) FASTENER WITH BILATERAL SEAL FOR LIQUID IMMERSION COOLING APPLICATIONS

(75) Inventors: Ethan S. Heinrich, San Pedro, CA (US); Alberto F. Viscarra, Torrance, CA (US); Jennifer G. Wensel, Fullerton, CA (US); Stephen E. Sox, La Canada, CA (US)

(73) Assignee: Raytheon Company, Waltham, MA (US)

( * ) Notice: Subject to any disclaimer, the term of this patent is extended or adjusted under 35 U.S.C. 154(b) by 1476 days.

(21) Appl. No.: 12/150,568

(22) Filed: Apr. 29, 2008

(65) Prior Publication Data

US 2009/0269162 A1    Oct. 29, 2009

(51) Int. Cl.
- F16B 5/00 (2006.01)
- F16B 5/02 (2006.01)
- F16B 43/00 (2006.01)
- F16B 33/00 (2006.01)
- H05K 7/20 (2006.01)

(52) U.S. Cl.
CPC ............. F16B 5/0275 (2013.01); F16B 43/001 (2013.01); F16B 33/006 (2013.01); H05K 7/20236 (2013.01)
USPC .......................... 411/371.1; 411/367; 411/389

(58) Field of Classification Search
USPC .............. 411/383, 384, 389, 369, 371.1, 367; 403/408.1
See application file for complete search history.

(56) References Cited

U.S. PATENT DOCUMENTS

| | | | | |
|---|---|---|---|---|
| 663,464 A * | 12/1900 | Prince | | 411/367 |
| 2,068,968 A * | 1/1937 | Urbanek et al. | | 411/367 |
| 2,359,046 A * | 9/1944 | Miller | | 411/368 |
| 2,439,516 A * | 4/1948 | Holcomb | | 174/159 |
| 3,202,033 A * | 8/1965 | Weidner, Jr. | | 411/371.1 |
| 3,889,569 A * | 6/1975 | Fanciullo | | 411/369 |
| 4,184,785 A * | 1/1980 | Marjollet et al. | | 403/337 |
| 4,334,599 A * | 6/1982 | Ritsema et al. | | 188/73.45 |
| 4,863,329 A * | 9/1989 | Wilson | | 411/339 |
| 5,271,689 A * | 12/1993 | Ishii et al. | | 403/408.1 |
| 5,690,456 A * | 11/1997 | Wedellsborg | | 411/383 |
| 6,053,682 A * | 4/2000 | Krauter et al. | | 411/369 |
| 6,241,444 B1 * | 6/2001 | Clarke | | 411/369 |
| 7,121,780 B2 * | 10/2006 | Matich et al. | | 411/367 |
| 2009/0092462 A1 * | 4/2009 | Pratt | | 411/368 |

* cited by examiner

Primary Examiner — Flemming Saether
(74) Attorney, Agent, or Firm — Christie, Parker & Hale, LLP

(57) ABSTRACT

A fastener assembly including an elongate fastener adapted to extend through a chamber having a longitudinal axis, a first end and a second end; a first seal disposed at least partially at the first end of the fastener to prevent leakage of fluid from the chamber; and a second seal disposed at least partially at the second end of the fastener to prevent leakage of fluid from the chamber. In a specific embodiment, the first and second seals are conical seals and a third seal is provided by a gasket. The invention also provides a method for securing a fluid filled chamber to a surface by using embodiments of the fastener assembly.

13 Claims, 4 Drawing Sheets

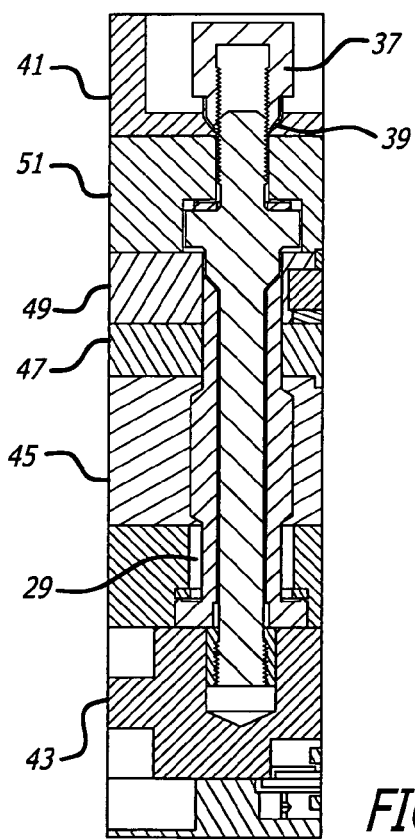
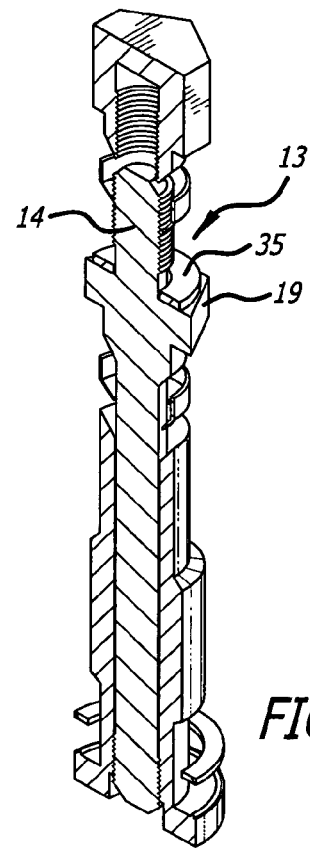
FIG. 6
FIG. 5

FASTENER WITH BILATERAL SEAL FOR LIQUID IMMERSION COOLING APPLICATIONS

BACKGROUND OF THE INVENTION

1. Field of the Invention

The present invention relates to mechanical devices and apparatus. More specifically, the present invention relates to fasteners for electronic circuit boards.

2. Description of the Related Art

In high performance aircraft and spacecraft applications, space is often limited and yet performance requirements are often quite high. The high performance requirements translate to complex electronic circuitry. The limited space available for the electronics leads to highly dense circuitry. These circuits must be fastened to the vehicle frame to hold the circuit together and to meet the structural requirements thereof. Unfortunately, with space at a premium, little space is available for fasteners.

This presents a problem, which is exacerbated by the cooling requirements for certain highly dense electronic circuits. Some circuits are cooled by liquid immersion, i.e., immersion jet impingement cooling. This requires some or all of the circuit fasteners to be routed around the cooling apparatus or vice versa to avoid a substantial increase in the space requirements of the circuit. In addition, high vertical interconnect counts and liquid seals require large clamping forces but leave little room for fasteners.

Hence, a need remains in the art for an improved system or method for fastening electronic highly dense circuits in space limited applications, particularly those requiring liquid cooling.

SUMMARY OF THE INVENTION

The need in the art is addressed by the fastener assembly of the present invention. In the illustrative embodiment, the invention includes an elongate fastener adapted to extend through a chamber having a longitudinal axis, a first end and a second end; a first seal disposed at least partially at the first end of the fastener to prevent leakage of fluid from the chamber; and a second seal disposed at least partially at the second end of the fastener to prevent leakage of fluid from the chamber. In a specific embodiment, the first and second seals are conical seals and a third seal is provided by a gasket.

The invention also provides a method for securing a fluid filled chamber to a surface comprising the steps of: placing an insert onto the surface such that a first end of the insert abuts the surface; placing the chamber onto the surface whereby the insert extends through an opening therethrough; threading a first end of a threaded fastener through the insert into the surface thereby closing a first lower seal arrangement; and securing the chamber to the surface by sealing the chamber with a nut thereby closing a second seal arrangement with respect to the chamber.

BRIEF DESCRIPTION OF THE DRAWINGS

FIG. 5 is a sectional perspective view of the fastener of FIG. 1 in disassembled relation.

FIG. 6 is a sectional side view of the fastener of FIG. 1 in an illustrative environment.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
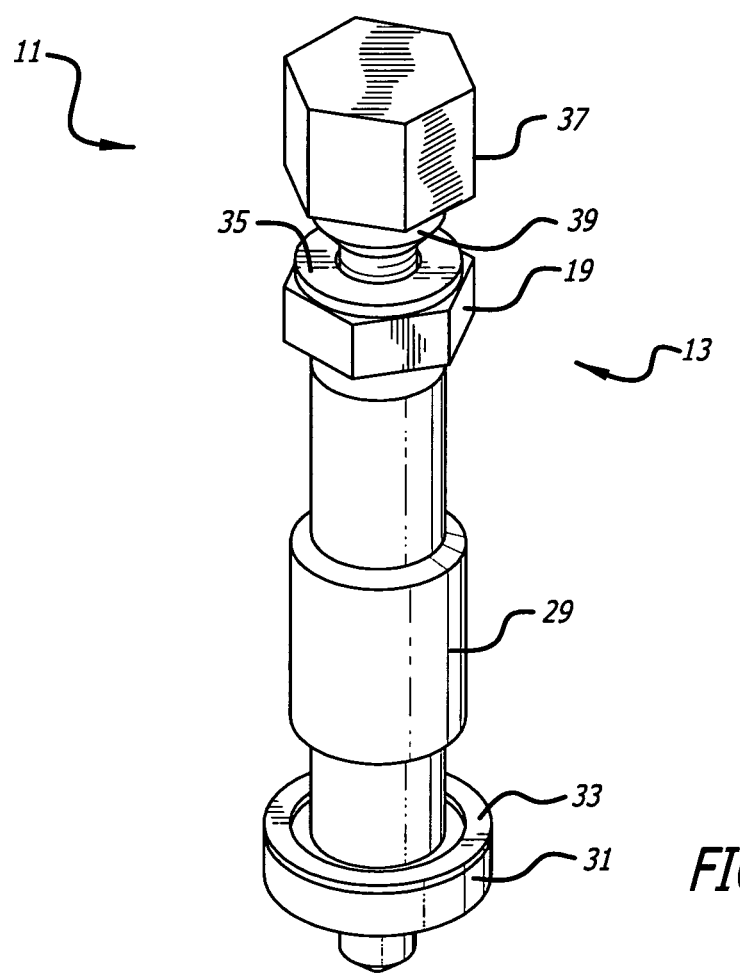
FIG. 1 is a simplified perspective view of an illustrative embodiment of the fastener of the present invention in assembled relation.
Figure 2:
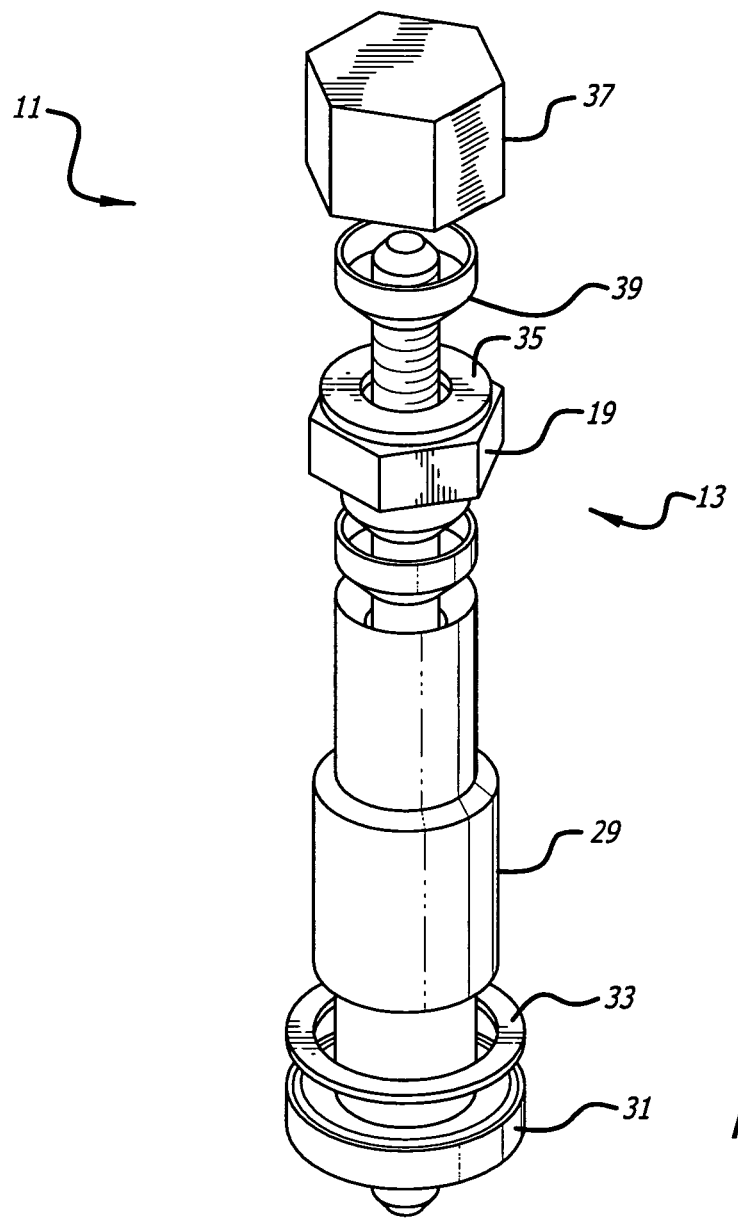
FIG. 2 is a simplified perspective view of an illustrative embodiment of the fastener of the present invention in disassembled relation.
Figure 3:
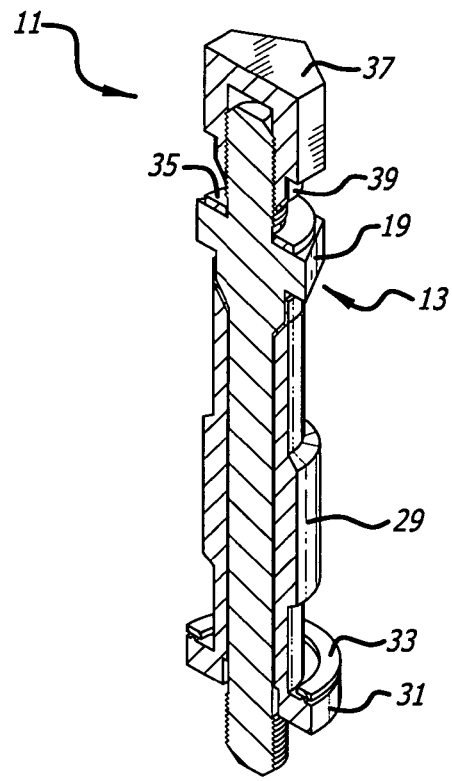
FIG. 3 is a sectional perspective view of the fastener of FIG. 1 in assembled relation.
Figure 4:
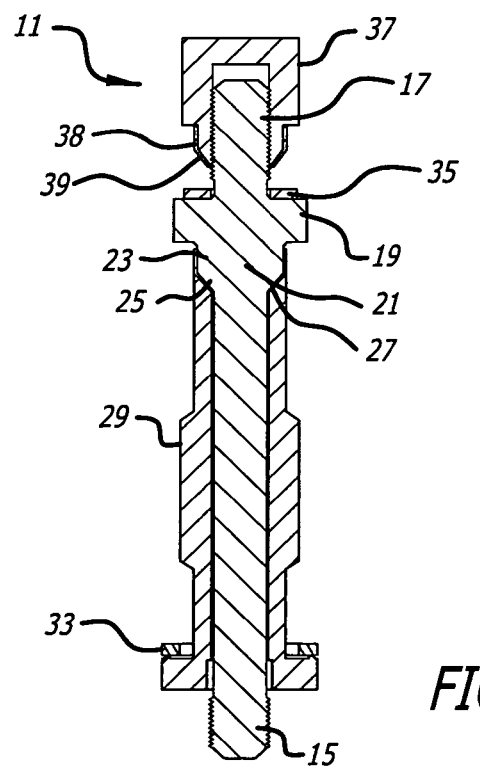
FIG. 4 is a sectional side view of the fastener of FIG. 1 in assembled relation.

As shown in FIGS. 1-6, the inventive fastener 11 includes an elongate bi-lateral fastener 13 including a shaft 14 with first and second threaded ends 15 and 17. Between the threaded ends and near the upper (second) end thereof is an annular (e.g. hexagonal) shoulder 19 integral with the shaft 14. As best illustrated in FIGS. 4 and 6, extending below the shoulder 19 is a collar 21. The collar 21 has an annular upper portion 23 and a tapered lower portion 25. In the illustrative embodiment, the lower portion is tapered at an angle of 37°. Further, in one embodiment, the fastener 11 includes a first seal 39 and a second seal 27. However, the invention is not limited thereto.

The collar 23 seats into the second seal 27. The seal 27 is tapered to match the contour of the lower portion 25 of the collar 21. In the best mode, the conical seal 27 is fabricated with annealed copper, however, the invention is not limited to the material construction of the conical seal or any other component disclosed herein. The conical seal 27 seats into an externally threaded insert 29. The insert 29 provides passage and an anchor point for the bilateral fastener. In the best mode, the insert is titanium, but the invention is not limited thereto. Other materials may be used such as steel or aluminum by way of example. The upper end of the insert 29 is tapered to receive the conical seal 27 and the lower portion 25 of the collar 21. A flange 31 is provided at the lower end of the insert 29 onto which an annealed crush gasket 33 is mounted.

A polymer gasket 35 is mounted on the upper side of the shoulder 19 to aid in maintaining pre-load. A seal nut 37 is provided at the top of the assembly 11. The seal nut 37 has a protrusion 38 adapted to engage the first conical seal 39. In the illustrative embodiment, the protrusion 38 and first conical seal 39 have a matching 37° taper as per the second seal assembly 25, 27, and 29. The first seal 39 engages a matching contour in a plate 41 in an external assembly as illustrated in FIG. 6.

In the illustrative embodiment, the fastener 13 and nut 37 are constructed of high-strength stainless steel, aluminum or other suitable material. The conical seals are annealed copper and the polymer gaskets 35 are rubber. The annealed crush gasket is annealed copper. However, the invention is not limited thereto. Other materials may be used without departing from the scope of the invention.

In one embodiment, the fastener 11 is assembled by securing (e.g., threading) the insert 29 onto a lower assembly 45 clamping the crush gasket 33. (See FIG. 6.) A broached hex 45 (not shown) may be provided in the lower assembly to receive the insert 29. The invention is adapted for use with one or more circuit boards disposed within a cooling chamber adapted to be filled with a coolant. In accordance with the present teachings, the components and the chamber are stacked and a hole is provided therethrough. Next, the component assembly stack 45, 47, and 49 is placed over the insert 29 so that the insert 29 extends through the provided hole.

Next, the upper portion 51 of the assembly is lowered onto the fastener 13 and rests on the polymer gasket 35 on the shoulder 19 thereof. The upper plate 41 is then placed over the fastener 13 and seats against the upper plate 49. The second conical seal 39 is inserted into a matching recess in the upper plate 41. The seal nut 37 is then threaded onto the upper threaded end 17 of the fastener 13 thereby closing the second conical seal 39. This seals the upper surface of the assembly against leakage.

Next, the upper portion 51 of the assembly 49 is lowered onto the fastener 13 and rests on the polymer gasket 35 on the shoulder 19 thereof. The upper plate 41 is then placed over the fastener 13 and seats against the upper plate 49. The first conical seal 39 is inserted into a matching recess in the upper plate 41. The seal nut 37 is then threaded onto the upper threaded end 17 of the fastener 13 thereby closing the first conical seal 39. This seals the upper surface of the assembly against leakage.

The cooling chamber (not shown) is then liquefied and pressurized with fluid fittings that allow for evacuation from one side of the chamber which fluid is injected from the other in a conventional manner.

Thus, the present invention has been described herein with reference to a particular embodiment for a particular application. Those having ordinary skill in the art and access to the present teachings will recognize additional modifications applications and embodiments within the scope thereof.

It is therefore intended by the appended claims to cover any and all such applications, modifications and embodiments within the scope of the present invention.

Accordingly,

What is claimed is:

1. A fastener assembly comprising:
    an elongate fastener adapted to extend through a chamber, the fastener having a longitudinal axis, a first end and a second end;
    an elongate insert disposed about said fastener;
    a seal nut engaging the fastener;
    a first seal disposed at least partially at said first end of said fastener to prevent leakage of fluid from said chamber, wherein a first conical end of the first seal contacts the seal nut and a second cylindrical end opposite the first end of the first seal is spaced from the fastener to create a gap between the first seal and the fastener, the gap configured to receive the seal nut; and
    second seal on said fastener to prevent leakage of fluid from said chamber, wherein the fastener defines a tapered collar which mates with a tapered portion of the insert to provide a seal between said fastener and said insert.

2. The invention of claim 1, wherein said first seal includes a first gasket.

3. The invention of claim 1, wherein said second seal is a first conical seal.

4. The invention of claim 3, further including an annular shoulder disposed about said fastener.

5. The invention of claim 4, wherein said first conical seal is disposed between said shoulder and said insert.

6. The invention of claim 5, further including the seal nut at said first end of said fastener.

7. The invention of claim 6, wherein said first seal includes the first conical seal between said seal nut and said shoulder.

8. The invention of claim 7, wherein said fastener has threads at said first and second ends thereof.

9. The invention of claim 8, wherein said seal nut is adapted to engage said threads at said first end of said fastener.

10. The invention of claim 9, wherein said threads at said second end of said fastener is adapted to engage a thread in an external surface.

11. The invention of claim 10, further including a second gasket between said seal nut and said protrusion extending around an external surface of said elongate insert.

12. A fastener assembly comprising:
    an elongate fastener having a longitudinal axis, a first end and a second end, said first and second ends being threaded, wherein said elongate fastener is adapted to extend through a chamber;
    an elongate insert at least partially disposed about said fastener;
    an annular shoulder integral with said fastener;
    a seal nut adapted to engage said threads at one end of said fastener;
    a first conical seal between said seal nut and said shoulder to prevent leakage of fluid from said chamber;
    a second conical seal disposed between said shoulder and said insert, wherein the fastener defines a tapered collar which mates with a tapered portion of the insert to form the second conical seal; and
    a first gasket extending around an external surface of said insert between said second conical seal and said second end of said fastener.

13. The invention of claim 12, further including a second gasket between said seal nut and said shoulder.

* * * * *